United States Patent

Labeyrie

[11] Patent Number: 6,151,287
[45] Date of Patent: Nov. 21, 2000

[54] OPTICAL MASS STORAGE DEVICE, WITH DATA RECORDING LIGHT-SENSITIVE LAYER

[76] Inventor: Antoine Labeyrie, Observatoire de Haute Provence, 04870 Saint-Michel-de-l'Observatoire, France

[*] Notice: This patent issued on a continued prosecution application filed under 37 CFR 1.53(d), and is subject to the twenty year patent term provisions of 35 U.S.C. 154(a)(2).

[21] Appl. No.: 08/973,039

[22] PCT Filed: May 23, 1996

[86] PCT No.: PCT/FR96/00777

§ 371 Date: Nov. 24, 1997

§ 102(e) Date: Nov. 24, 1997

[87] PCT Pub. No.: WO96/37887

PCT Pub. Date: Nov. 28, 1996

[30] Foreign Application Priority Data

May 23, 1995 [FR] France .................... 95 06554

[51] Int. Cl.$^7$ ........................................ G11B 7/00
[52] U.S. Cl. ........................... 369/103; 369/275.1
[58] Field of Search ................... 369/103, 109, 369/108, 275.3, 275.4, 275.1, 276, 285, 286, 284

[56] References Cited

U.S. PATENT DOCUMENTS

| | | |
|---|---|---|
| 3,912,391 | 10/1975 | Fleischer et al. . |
| 5,283,777 | 2/1994 | Tanno et al. ............................ 369/108 |
| 5,377,176 | 12/1994 | Redfield . |
| 5,377,179 | 12/1994 | Redfield et al. ..................... 369/275.1 |
| 5,477,347 | 12/1995 | Redfield et al. ........................ 369/103 |
| 5,566,387 | 10/1996 | Dewald .................................. 369/103 |

FOREIGN PATENT DOCUMENTS

| | | |
|---|---|---|
| 8906385 | of 1989 | WIPO . |
| 9502880 | 1/1995 | WIPO . |

*Primary Examiner*—Thang V. Tran
*Attorney, Agent, or Firm*—Fulbright & Jaworski

[57] ABSTRACT

An optical mass storage device such as an optical disc is described, which includes a light-sensitive layer (1) with elementary cells distributed over its free recording surface (10), in which data is recorded. The device is characterised in that it includes, for each elementary cell, a light guide portion (3) which forms a single-mode optical fiber of a photorefractive material, substantially orthogonal to the free recording surface (10) A structure obtained by Lippmann effect, and formed of stacked individual periodic laminations having the same orientation as that of portion (3), is recorded in the fiber. The light-sensitive layer (1) is arranged on a transparent substrate (2).

13 Claims, 3 Drawing Sheets

OPTICAL MASS STORAGE DEVICE, WITH DATA RECORDING LIGHT-SENSITIVE LAYER

The invention relates to the design and fabrication of optical mass memory devices, such as optical discs (or laser discs), as well as to recording and reading out information data as stored in such memories using a beam of laser light. It must be understood however that while the configuration of so-called compact discs in standard dimensions fulfil important industrial needs, it is not limitative, and mass data storage memories with similar composition and structure can be formed on other types of substrates, for example tapes or films.

BACKGROUND OF THE INVENTION

The storage capacity of present optical memory devices appear quite inadequate for many applications. One does not know how to do more than storing information data at the surface of a photo-sensitive layer covering the disc side. Most often, micro-dips on which the light beam is focused are engraved on such an optical coating, which form elementary cells for data recording that are distributed over the photo-sensitive surface. Owing to the area each of them occupies and to their necessary spacing, their number is limited.

With a view to increasing the memory capacity of optical discs, several solutions are currently been studied. One may mention:—double-sided discs,—the use of blue laser light, allowing a slight size reduction for the elementary cells in agreement with the theory of diffraction,—the superposition of several photo-sensitive layers, in limited number however (six for example or up to ten), which in addition requires as many lenses to focus the light on the different layers, both for recording and read-out.

These different solutions allow only to increase the capacity of current optical discs by at most ten times, which is not a sufficient increase for the needs of industry.

One can also envisage to use substrates bearing several differently coloured layers, as is the case in color photographic films. But, in fact, it is difficult to have more than a few layers, owing to the interactions among the coloured light beams to be used both for recording and read-out, and therefore the memory increase remains limited.

SUMMARY OF THE INVENTION

The problem that the present invention intends to solve is to provide an optical-type mass memory with much improved memory density, compared to that of current optical discs, by allowing advantageously to record hundreds of data bits in a zone corresponding to the Airy peak of a microscope lens, said peak being generally approximately one micron wide.

To this end, the invention proposes to resort to the aptitudes for volume holography of photo-sensitive mediums volume that have been explored in another field, and to combine thereby, for data storage, a high lateral density over the surface of the optical layer with a high vertical density in depth.

To this effect, an object of the present invention a is a mass optical memory, of the kind having a photo-sensitive layer, preferably formed on an optical disc, which includes elementary cells distributed across its free surface, for recording data reaching it in a laser beam to which it is exposed, the data thus recorded being retrieved through read-out with a laser beam.

The memory according to the invention comprises, for each elementary cell, a light guiding rod operative as a single-mode optical fibre, made from a photo-sensitive material, the axis of which is approximately orthogonal to the free recording surface.

When a fibre in such layer is exposed to a data carrying beam, it is created therein, through Lippmann's effect, standing waves with multiple wavelenghts that, by acting on the light-sensitive material, generate a structure comprised in each fibre of a pile of periodic stratifications superposed along the rod axis and forming an interferogram.

In each rod within a photo-sensitive layer according to the invention, having a structure forming a lattice of monomode fibres directed transversally to the accessible exposure face, data are recorded in a retrievable form as a stratification of its optical properties which, through the addition of periodic patterns, is globally aperiodic.

As indicated above it is not new per se to use the Lippmann effect to impress sensible layers. In particular US Patent document U.S. Pat. No. 5,377,176 describes the phenomena in their use for color photography. It is explained therein how three light beams with three different frequencies, that are each of coherent monochromatic light but anharmonic from one to the other, produce standing waves with nodes and loops coexisting along a single pass within a layer of transparent material.

The same document provides for retaining a trace of interferogram, as a mark of three periodic stratifications, in a light-sensitive material for which it gives a number of examples. It has further the interest of describing methods and devices that can be used on one hand during the exposure permitting recording a hologram, on the other hand during reading to restitute the recorded hologram.

However it appears clearly that the author of the document although it dates back to 1963 was not able to do more than using a perforated mask to lighten its material for impressing so as to separate the recording zones. Now, such a mask not only introduces perturbation through diffraction already before admission in the light-sensitive material, but in addition there is nothing to avoid that the stratifications produced in the close zones of the material contaminate mutually due to evanescent waves being diffused.

Through previously creating a distribution network in the optical properties that gives the equivalent of monomode wave guide fibres within the material, the present invention permits to avoid the resulting drawbacks, and for storing information data received on the optical form, it allows in combination both a high density in the depth of the light-sensitive layer and a high density in the distribution over the surface.

The photo-sensitive layer is advantageously coated onto a transparent substrate which supports it, and which has a disc shape, in agreement with usual standards for previously known optical memories.

The use of the Lippmann effect allows to record several hundred data bits in the depth of the light-sensitive layer along each rod, thus for each recording zone, whereas the storage density did not exceed 1 bit per square micron previously, for laser beams having a wavelength located in the visible region. One then obtains a corresponding increase of the memory capacity with respect to previous systems.

In addition, the confinement of any light spot, ensured by the fibre structure in the direction transverse to the accessible surface of the light-sensitive layer, allows a higher density of cells or elementary zones in their distribution on the surface of the recording layer. This confinement avoids the undesired divergence of the beam; therefore its focus is maintained, and this without difficulty all along the length of the monomode fibres thus obtained. That length is that of the sensitive layer thickness, advantageously amounting to some tens or hundreds of microns, or more precisely from 50 to 1000 microns.

The light-sensitive material used for implementing each of the rods behaving as an optical monomode fibre, can be of any known nature. According to a first mode of implementation of the invention, it consists of a light-refractive material, the refractive index of which varies according to the exposure light, Such light-refractive materials are either of mineral composition, such as lithium niobate or barium titanate, or of organic composition and made of polymers.

In other situations, one will prefer to use materials exhibiting light-sensitivity in relation with phenomena of magnetization and demagnetization in ferrous particles which they include, as is the case for magneto-optical materials which recently appear for use in obtaining re-writable memory systems. An article published in the April 1995 issue of "PHYSICS TODAY", Awschalom D. D. and Divicenzo, D. P, recommends for this purpose a material made from organic molecules incorporating iron atoms which bring the magnetization susceptibility.

In further situations, an equivalent sensitivity to laser light can be obtained through a thermal effect causing somehow a local burning of the light-sensitive layer. In all cases, the phenomenon can be reversible, or at least approximately reversible, under appropriate adaptations of the means used respectively for recording and for reading.

Within the scope of using fundamentally photo-refracting materials to implement the invention, one will in practice be lead most often to prefer organic materials to more classical semi-conductor minerals. Indeed, following rather recent research in the area of macromolecular chemistry, the polymer industry is now able to produce transparent materials the refractive index of which may be adjusted more or less permanently under the action of light. One will particularly think to those based upon polymers and copolymers of polyalkylmethacrylates, and more specially polymethylmethacrylate.

There exists in particular such materials based upon chains of polymethacrylates copolymerized with reticulating agents, such as polyvinyl-pyrrolidone or polyvinyl-carbazole, in the presence of a photo-polymerization initiator. Reticulating curing of the corresponding polymer composition is then selectively achieved in the regions where this composition is exposed to light irradiation with appropriate intensity.

The nature of the functional moieties of each component in such a composition, the relative proportions of its components, and those of suitably chosen complementary substituents, allow to adjust the optical properties, in a localized manner, with levels of accuracy and safety often superior to those of the properties displayed by crystalline semi-conductors. In particular, the knowledge acquired in the physico-chemistry of macro-molecules facilitates a differentiated adjustment, first for the sensitivity of the composition to an irradiation causing a permanent localized reticulation, and second for a similarly localized photoconductivity which depends on active sites, created by grafting on the macro-molecules which act as charge carriers.

As an example, an article published in the January 1995 issue of "PHYSICS TODAY", pages 17 to 19, indicates the composition of such a polymer in which the addition of an electron acceptor increases the photo-sensitivity, and that of electro-optical absorbent brings the non-linearity effect needed for the photo-refractive action. Furthermore, the presence of a plastifier favours the alignment of the dipoles present within the electro-active chromophore moieties with the direction of an electric field. With such compositions, one can obtain transparent materials having an extremely fine structure, in which the distribution of magnetic-moment sites arises at the nanometer scale.

Other characteristics of the invention relate to the implementation of the physical constitution of the light-sensitive layer made as a fibered structure of monomode optical fibres.

Following one of the implementation modes of the invention from this point of view, the optical guide rods are obtained from pits dug into the surface of a substrate, by filling these pits with a photo-refractive polymer resin in liquid form, and subsequently curing the polymer to a solid.

However, according to the invention, one prefers to produce the optical guide rods by a photo-electrical process, which consists in exposing a layer of photo-refractive material, before inscribing any data, to the simultaneous irradiation from several collimated beams of laser light so as to generate a honeycomb-like array, or lattice, which penetrates the volume of the layer, considering the absence of focusing effects.

In a general way it is appropriate to that aim to use a minimum of three beams of coherent light directed towards the layer of a photo-refractive material along respective directions at 120° from each other. One obtains thereby a honeycomb network pattern of monomode fibres, and for three beams the network shows an hexagonal distribution pattern.

However it has been observed that it is more advantageous to use in the single step a higher number of beams, preferably four in practice, and in such a case the honeycomb distribution obtained is more precisely with quadrangular and in particular square meshes.

The invention relates also to preferred means for performing the recording and read-out of information data in a mass memory such as defined above.

Part of these means are known, in particular as regards the equipment for focusing the laser beams onto the entrance of a cell or elementary recording zone and for displacing them in order to scan such cells sequentially with the same beam.

But, there is advantage in using emitting or receiving laser-type devices also based upon the Lippmann effect. One will here profitably refer to the description of it given in a second patent application submitted the same day by the same applicant, under the title "Process and devices of laser emission and reception for optical data transmission" (French Patent No. 95 06104 filed May 23, 1995).

BRIEF DESCRIPTION OF THE DRAWINGS

Further characteristics and advantages of the invention will appear from the following description of special implementation examples, made with reference to the appended drawings in which.

DETAILED DESCRIPTION OF THE INVENTION

Figure 1:
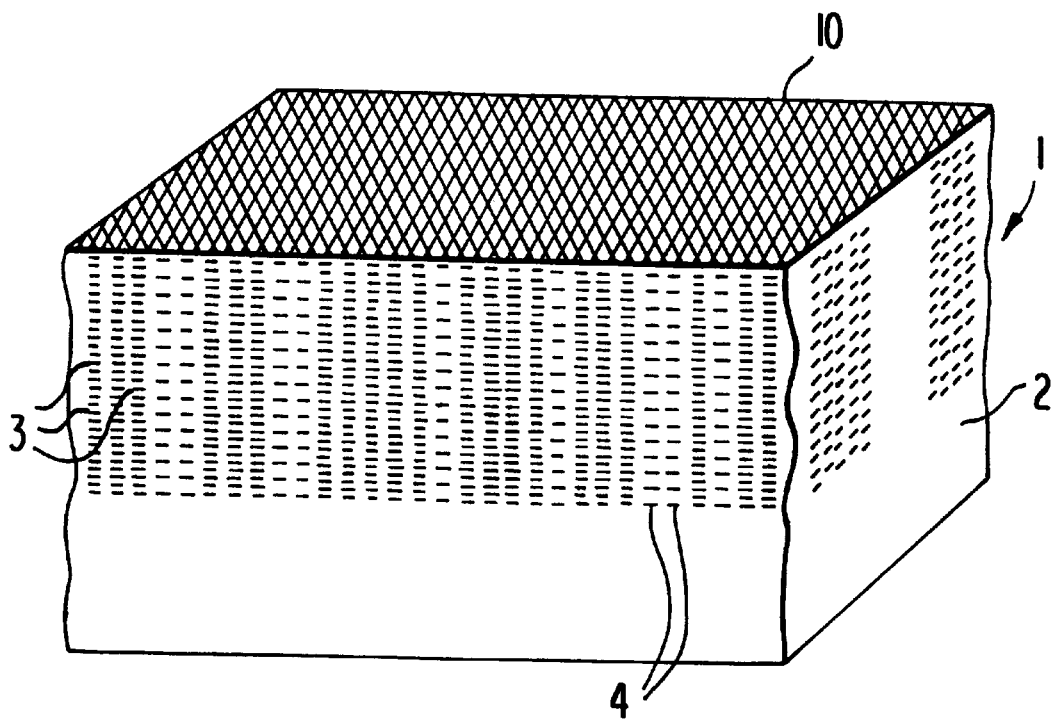
FIG. 1 represents schematically, for part of the recording surface, the basic structure of a mass optical memory conforming to the present invention.

The partial cross-section of FIG. 1 shows the internal structure of the data recording face in a laser optical memory disc according to the invention, assuming that data have already been recorded. This structure is comparable to a Lippmann structure, in as much as it shows the inscribed trace of interferograms produced by Lippmann's effect.

One knows that this refers to a structure produced in a black-and-white light-sensitive layer in which one has formed standing waves of light which created narrow stratifications within the volume of the layer. Following a suitable development operation, one observes a superposition of periodic stratifications, each of which derives from one of the wavelengths present in a light beam to which the layer has been exposed, and has a period amounting to half this wavelength. One could produce in this way a color photograph which is viewed by reflection of a white-light beam. This technique has been used to produce holograms.

The present invention involves having a structure of this type in a layer of photo-sensitive material 1 deposited on a substrate 2. On its free recording face 10, this layer 1 includes, for each elementary area zone corresponding to the Airy area of a microscope lens as used for read-out, a light-guide rod, operative as a single-mode optical fibre rod, having a quasi-transparent optical structure.

Each of these rods behaves as a separate monomode light guide, able to receive a Lippmann structure. The profile of the periodic stratifications created during the recording step is an interferogram which is the Fourier transform of the spectrum of the light beam used for recording.

Upon reading, the recorded structure reflects selectively a series of different wavelengths of light. Considering the special case when the interaction with light is linear, the spectral dependency of the reflection coefficient of the structure is the Fourier transform of the profile describing distribution of refractive index, real or complex, in the stratification. The spectrum of the light used for recording is thereby exactly restituted in the light reflected upon reading.

On FIG. 1, one has such optical fibre rods 3 and 4 are schematically represented with their stratifications. Some rods 4 show wider spaced stratifications, such as corresponding for example to the reflection of red light; other rods 3 show a tighter periodicity of stratification which would correspond for example to the reflection of blue light. However, in each of these rods, the stratification is aperiodic when implementing the invention in real practice, since they correspond to cumulating different wavelengths into a spectrum integrating the information data from a whole data sequence.

The stratification of a fibre involves a modulation of its refractive index along its axis. The index profile is the Fourier transform of the spectrum of the light beam used for recording. According to Bragg's law, each sine wave component of the stratification reflects light under a single distinct wavelength, proper to it, having a value which in the transparent medium amounts to twice the period of the sine wave.

The information recorded in a fibre is read by injecting a wide-band laser beam in the fibre and spectrally analyzing the reflected light. This can be achieved with a microscope lens focusing a spot of laser light at the entrance of the fibre, and collecting the reflected light.

In a particular mode of implementation, the spacing of two vertical optical fibre rods is about 0.5 to 2 microns and the length of each extends across a layer thickness ranging from 20 to 200 microns. In practice, for better fidelity, it will be preferable to increase the thickness of the sensitive layer up to values from 100 to 500 micrometers. The width of the fibers in transverse section remains always close to the light wavelength. That means for example using widths of 0.5 microns distributed according to a network pattern pitch of 1.4 microns, such as can be obtained using a technique described below.

Figure 2:
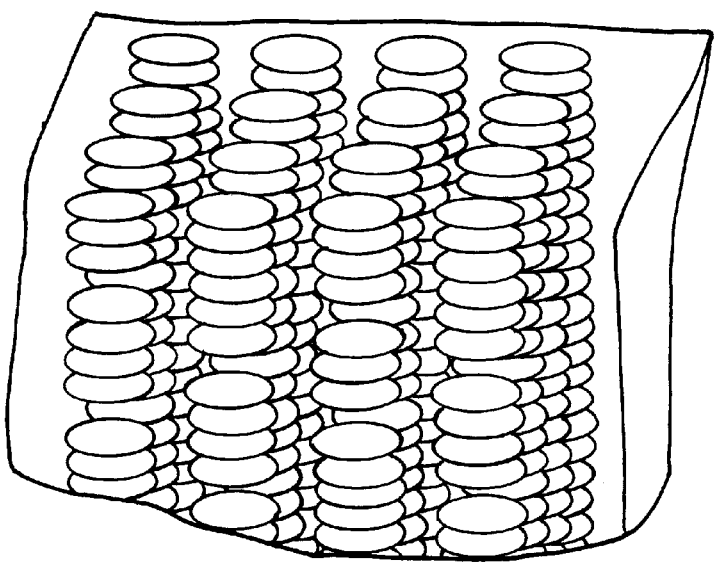
FIG. 2 illustrates schematically, the principle of a method for producing an optical memory of this type.

The distribution of the fibers on the recording surface corresponds to that of a honeycomb pattern as illustrated under 10 on FIG. 1. The pattern is preferably of quadrangular type, with square meshes as illustrated on FIG. 2, rather than hexagonal meshes, each configuration being related to the process selected for generating the network made of a bundle of monomode fibres before effecting any data registering. In all events, the network pattern pitch is thin enough so that each rod therein be able to operate as an optical monomode fibre, during both recording and reading steps.

The optical fibre rods, or more generally the whole photosensitive layer including all fibres in it, are made from a photo-refractive material, that is a material the refractive index of which, as modified by exposure to light, depends upon the illumination locally received. This property allows to inscribe an interference pattern in the material.

Depending upon the material used, it may result from the fact that, in highly illuminated areas, the absorption can create positive and negative charges which separate and redistribute, creating an electric field which, in turn, causes a variation of the refractive index.

As a compound for constituting the photo-refractive material, one can for example use lithium niobate or barium titanate. Preferably, one will use organic materials such as the photo-refractive polymers, Once the recording inscription of the fibres has been performed, the axial modulation of the refractive index in each optical fibre rod is stabilized by an appropriate physical and/or chemical treatment, to be chosen in accordance with the photo-refractive material used.

For manufacturing optical discs according to the invention, or similar layers forming a mass memory for data recording, one may utilize different processes.

It will be recalled here that one can produce pits dug into the upper face of the substrate, which are then filled with a photo-refractive resin used in liquid form and subsequently cured to solid form either before or after the recording step. For the widths of micronic range used here, one can choose to produce such pits by moulding, using a matrix that manages the wells in a photorefractive layer supported on a convenient substrate. That moulding technique is comparable to the one used for duplicating diffraction gratings and micro-lenses arrays. Thence, the moulded photo-sensitive layer and its substrate are made of a single sheet, in the same way as is done in the initial steps when manufacturing known optical discs.

However, it is highly preferred, according to the invention, to produce the layer 1, in its pattern of monomode optical fibre rods, using a photochemical fabrication technique, such as described by A. Labeyrie in the journal "*Electro-Optical Systems Design*" dated February 1971, pages 32 to 38.

In a specific example carrying out the invention in a suitable manner, one uses a layer of photo-refractive polymer from 100 to 300 microns thick, the material being made of a resin marketed under trademark Omnidex 600 by the firm Du Pont de Nemours.

In practice, that firm proposes commercially a series of materials of such type, under the form of films temporarily protected between two foils of polyethylen terephtalate, or Mylar. The compositions, as they are described for holographic records and contact duplications in the paper "Hologram recording in Du Pont's new photopolymer materials" (published in *"Practical Holography"*, IV, SPEI OE/lase conference Proceedings, 1212-04, Los Angeles, Calif. Jan 14–19, 1990), are based on a composition comprising a polymer binder, polymerizable monomers, a photo-polymerization promoting system, and photo-sensibilizing agents active under determined wavelenghts, plus additives such as plastifiers and surfactants that enable to control its physico-chemical properties.

In using that composition to manufacture the memory layer according to the invention, the photo-refractive layer is fixed upon a substrate made of a synthetic transparent material. It is then exposed over all its free surface to light from a plurality of collimated laser beams, at least three as described in the paper referred to above.

The exposure to light leads to an interference pattern of cells of honeycomb or quadrangular shape that penetrates the volume of the photo-refractive polymer, across the whole depth of the layer, owing to the fact that the interference pattern is insensitive to defocus. There results a corresponding modification of the local properties of the material, with the equivalent of monomode wave guiding fibres being formed.

Of course, a second exposure is needed to record the information data in each fibre. Finally one obtains thereby a structure such as that of FIG. 2, which shows schematically a fragment obtained by recording through the Lippmann's effect in a square-meshed pattern as generated by the interference of four beams.

The refractive index of the material is higher in the fibres than in the intermediate medium between them, and that ensures that the light injected at the input in each fibre be guided upon writing or reading. The refractive index itself is modulated in each fibre into striates produced by a polychromatic Lippmann stratification. Thereby, each fibre retains in memory as many data bits as it received in coded form in for example 100 different wavelengths of a single beam.

Different laser wavelengths can be required to achieve the global initial exposure and the local inscribing exposures, as well as for intermediate steps of the process. For example, the formation of optical fibre rods can be induced through an exposure to ultra-violet light, or a ultra-violet exposure followed by a stabilisation step for the structure of optical fibre rods, with a subsequent step of sensitization for response to visible light.

According to a variant of the invention, which is specially advantageous for industrial implementation, one will have recourse to other materials particularly convenient for recording and reading by optical means, such as recently proposed ones. In particular, reference is made here to the article published in the edition of May 3, 1996 of the review Science under the signatures of Sato et al. It proves the existence of a photo-induced magnetization for iron/cobalt cyanide incorporated in an organic molecule, which shows however the drawback that to operate they require being used a low temperature.

Those different processes allow to generate optical fibre rods in which one can record several hundred bits, thus allowing to envisage optical discs with a memory capacity reaching a hundred gigabytes per square decimetre.

Reading out the recorded information data is achieved for each optical fibre rod by focusing a laser beam on the rod entrance, so as to inject a guided wave in the rod. If the laser beam has a wide band width, some wavelengths are reflected by the stratified structure recorded in the rod, according to the Lippmann's effect, and are directed back towards the laser.

A beam-splitting arrangement directs the returning beam towards a detector with spectral analysis capability. This detection can be achieved with a miniature spectrograph, using for example, a mode selector and a linear array of diodes for fast parallel readout. One can also utilize a parallel Fourier spectrograph, for example in the form of a stratified diode array, utilizing again the Lippmann effect, which is part of the above-mentioned simultaneously submitted patent application.

In order to accelerate the read-out, by reading simultaneously several fibre rods, the single laser can be replaced by a series of lasers, in which case one uses also a series of spectral analysis detectors.

Figure 3:
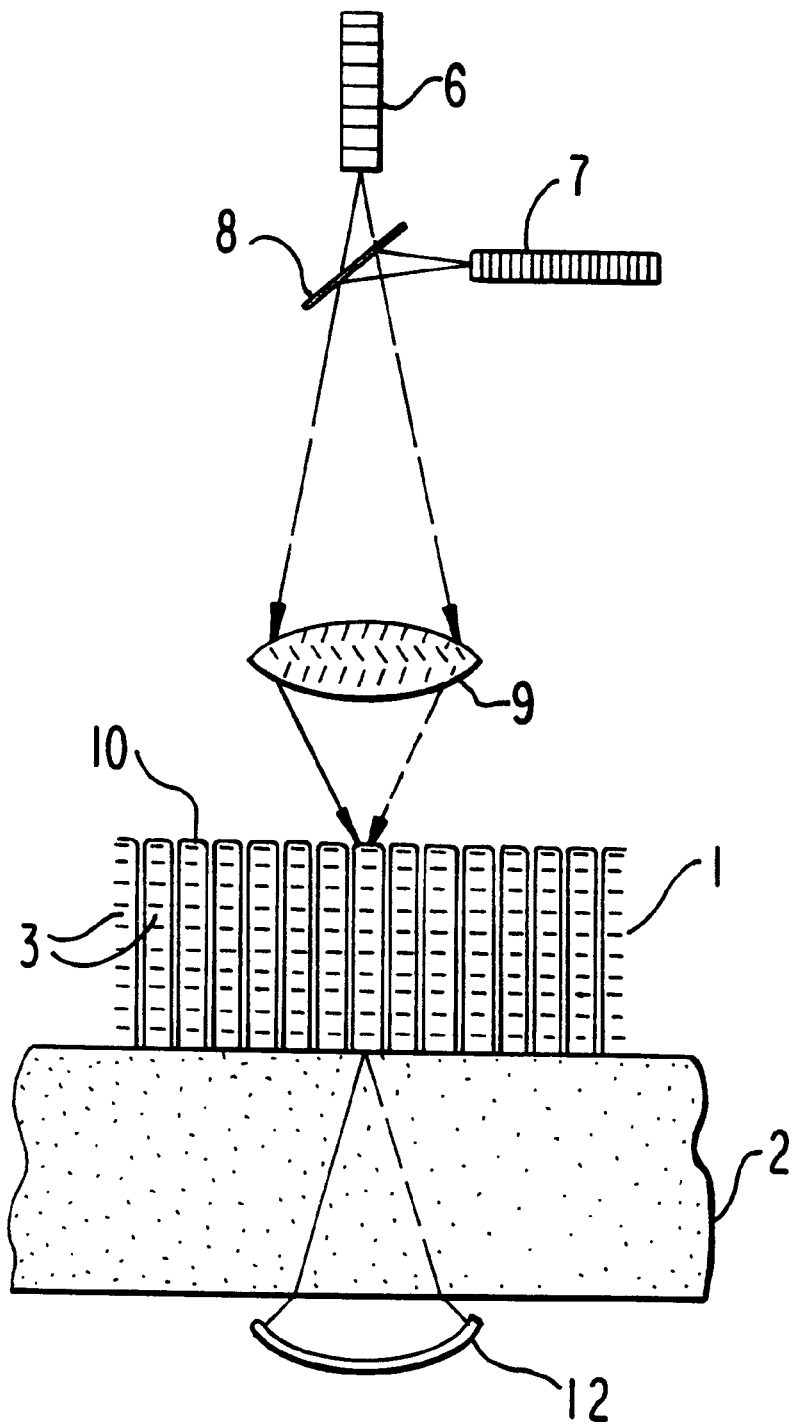
FIG. 3 schematically illustrates a first mode of recording and read-out of information data.
Figure 4:
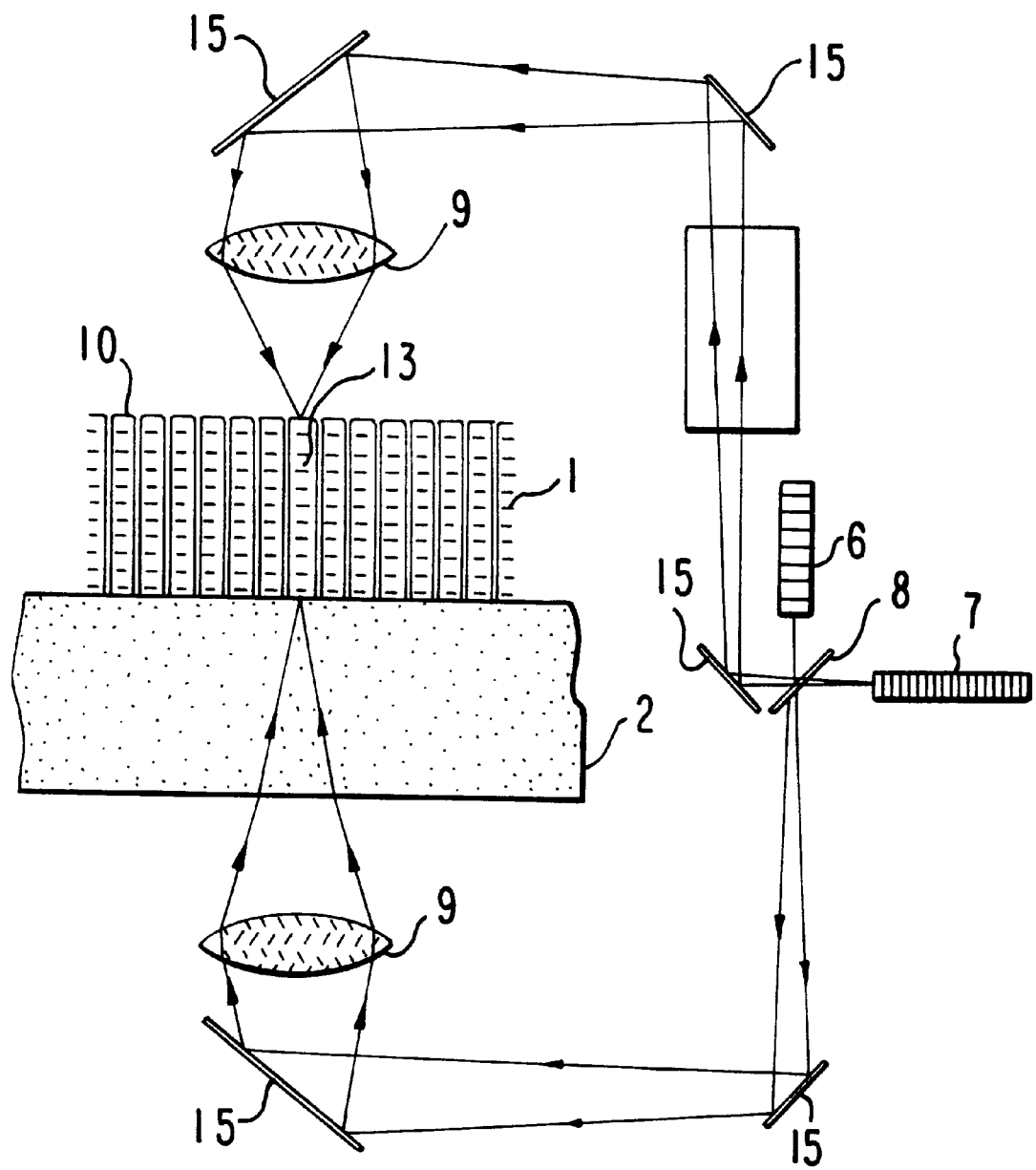
FIG. 4 illustrates a second mode of recording and read-out.

FIGS. 3 and 4 each represent a device allowing the recording and read-out of data in an optical memory according to the invention. Layer 1 and substrate 2 are represented partially in cross section. In both cases, for recording, one uses only a laser emitter 6 having an instantaneous spectrum which carries the global data information multiplexed by simultaneously modulating a series of excitation currents in the emitter, as described in the same patent application mentioned above. When reading, the beam from a laser 6 is transmitted through the beam-splitter 8, serving to direct the retro-diffracted light from the disc to detector 7.

A lens 9 focuses the beam onto the entrance of a fibre rod 3. During the data recording, the light penetrating the fibre is transmitted to the other end and through the transparent substrate 2, then reaches spherical mirror 12 which reflects the light and re-focuses it onto the end opening of the fibre rod. The photo-refractive material of this rod is thus exposed to the action of two beams propagating in opposite directions, the interference of which creates standing waves. These standing waves inscribe in the photo-sensitive material of the fibre a superposition of refractive index stratifications, according to the Lippmann effect.

During the read-out of data previously recorded, laser 6 emits light having a continuous spectrum, and mirror 12 is masked. Some wavelengths are selectively reflected towards the laser 6 and the detector 7 by the recorded Lippmann structure. Detector 7, which itself is a photo-electric version of Lippmann's plate considered as a spectrographic detector, emits a series of electrical signals, the distribution of which is the Fourier transform of the spectrum reflected by the fibre.

In order to accelerate recording and reading, it is possible to utilize several laser sources in parallel, arranged in such a way that their beams focused by a single lens 9 penetrate several neighbouring fibres. It can also be advantageous to use several recording and reading heads.

FIG. 4 represents a variant in which mirror 12 is not used. During recording, the beam from the laser which is reflected from beam-splitter 8 is directed towards mirrors 15 and through a lens 91 to the bottom aperture of the fibre, where it is focused. Thus, the beams which penetrate into a fibre through both its end apertures produce standing waves like in the previous case. During read-out, one of the beams is not utilized, and the detection of the Lippmann-effect reflected beam is achieved by the detector 7 as in the previous case.

Between recording and read-out, the disc can undergo a physical or chemical processing for developing or stabilizing the latent image.

By achieving an appropriate compensation of the optical path and of dispersion, one can obtain a symmetrical central fringe in rod 3. If a mirror is utilized as in the case of the drawing, pulse frequency modulation techniques can be used to optimize the interferogram obtained, regarding its time coherence and contrast. This is performed through dephasing the stratification components obtained for different wavelengths, using dispersive elements in one of the interferometer arm paths, or appropriately designed dielectric mirrors.

The recording of different wavelengths is simultaneous if one proceeds as described above, but it could be sequential, in however less advantageous implementation variants of the invention.

For read-out, mirror 12 in FIG. 3 is not present or a shutter 14 is introduced in such a way as to mask the beam extracted by beam-splitter 8; in both cases, the laser emits broad-band light and the diode array 7 is the spectral analysis detector.

According to another variant (not shown by the drawings), a reflective layer directly deposited onto either one of the interfaces of the assembly formed by layer 1 and substrate 2 serves to create the standing waves; it can however be necessary for reading out to remove it or to render it transparent.

The optical memory according to the invention is particularly designated for the fabrication of recording and reading systems for the high-density storage of digital or analogical data on discs or plates. It is also concerned with the fabrication of fixed or removable data carrying discs.

At present it seems that the invention will find its best development as a data recording memory under the form of a layer on a support disc rotatively mounted in such an optical reading drive as for compact or CD-ROM discs, but a system including a rotating laser head and a static disc would also be convenient; Besides, the records can be duplicated by optical transfer from one disc to another. it is valuable to notice that the invention permits to multiply the storing capacity by one or two orders of magnitude (for instance from 50 to 200), this result is not dependant upon the wavelength or the recording and/or reading light, nor upon the rotating speed of a disc supporting the data recording photosensitive layer. Consequently, a data reader, or a read/write drive in the case of a re-writable memory layer, can be implemented under forms enabling compatibility with presently existing systems and discs.

What is claimed is:

1. An optical memory medium, comprising a light-sensitive layer having elementary cells for recording information data which are distributed across a free recording face thereof, wherein each elementary cell of the light-sensitive layer consists of an optical guide rod operative as a monomode optical fiber directed with its axis substantially orthogonal to the free recording face.

2. An optical memory medium according to claim 1, wherein all rods constituting said cells have each a width in the micronic range and are transversally distributed along with a regular pitch throughout said layer thickness, whereby each of said rods is effective in registering along its axis a Lippmann's structure formed by a stack of superposed periodic stratifications that constitutes an interferogram of multiplexed information data received as coded in the wavelengths of a light beam.

3. An optical memory medium according to claim 1, wherein said optical guide rods are arrayed in a photo-refractive material through a holographic process by exposing the layer of photo-refractive material to the illumination of several collimated beams.

4. An optical memory medium according to claim 1, wherein said light-sensitive layer is supported on a transparent substrate.

5. An optical memory medium according to claim 1, wherein said optical guide rods are obtained by at least one of the following of: digging pits in the surface of a substrate or by moulding them from a master, and by filling these pits with photo-refractive resin in liquid form which is subsequently solidified.

6. An optical memory medium according to claim 1, wherein said layer is made of a material comprising a compound showing photo-induced magnetization.

7. An optical memory medium according to claim 1, wherein said layer is made of a light-refractive material comprising a photo-sensitizing agent.

8. An optical memory medium according to claim 2, wherein said elementary cells are obtained by exposing a light sensitive material supported on a transparent substrate to illumination by coherent light beams simultaneously directed to it to produce holographic interferences therein.

9. An optical memory medium comprising a light-sensitive layer supported on a transparent substrate, said layer having elementary cells for recording information data, wherein each said elementary cell consists of an optical light guiding rod having a width of a micronic range thereby being operative as a monomode optical fiber, all rods constituting said cells extending through said light-sensitive layer with each having an axis substantially orthogonal to a free recording face of said layer over which said cells are transversally distributed according to a regular pitch.

10. An optical memory medium according to claim 9, wherein said rods extend along a thickness of said photo-sensitive layer ranging from 50 to 1000 microns.

11. The optical memory medium of claim 9, wherein said medium is supported on a CD-rom disk.

12. A method for recording data on an optical memory medium according to claim 9, comprising sequentially directing a polychromatic light beam separately into each of said rods, whereby recordation of data received as coded in the wavelengths of said beam is achieved in the form of a Lippman's stratification structure in each said rod.

13. A method for reading data from an optical memory medium according to claim 9, comprising sequentially directing a polychromatic light beam separately into each of said rods, whereby data recorded therin in the form of a Lippmann's stratification structure are read out by spectrally analyzing the laser beam reflected from said medium.

* * * * *